United States Patent
Waldmann et al.

(10) Patent No.: US 12,480,681 B2
(45) Date of Patent: Nov. 25, 2025

(54) ACTUATOR FOR A DAMPER AND METHOD THEREOF

(71) Applicant: Siemens Industry, Inc., Alpharetta, GA (US)

(72) Inventors: Samuel Waldmann, Barrington, IL (US); Dean B. Anderson, Wonder Lake, IL (US)

(73) Assignee: Siemens Industry, Inc., Alpharetta, GA (US)

(*) Notice: Subject to any disclaimer, the term of this patent is extended or adjusted under 35 U.S.C. 154(b) by 360 days.

(21) Appl. No.: 18/047,379

(22) Filed: Oct. 18, 2022

(65) Prior Publication Data

US 2024/0125506 A1 Apr. 18, 2024

(51) Int. Cl.

| F24F 11/88 | (2018.01) |
|---|---|
| F24F 11/35 | (2018.01) |
| H05K 5/00 | (2006.01) |
| H05K 5/02 | (2006.01) |
| A62C 2/24 | (2006.01) |
| F24F 13/14 | (2006.01) |

(52) U.S. Cl.
CPC .............. *F24F 11/88* (2018.01); *F24F 11/35* (2018.01); *H05K 5/0047* (2013.01); *H05K 5/0247* (2013.01); *A62C 2/24* (2013.01); *F24F 13/1426* (2013.01); *F24F 2013/1433* (2013.01)

(58) Field of Classification Search
CPC ........ F24F 11/88; F24F 11/89; H05K 5/0047; H05K 5/0247; H02G 3/0625
See application file for complete search history.

(56) References Cited

U.S. PATENT DOCUMENTS

| 2,680,776 | A | * | 6/1954 | Smith | H02G 3/0633 |
| | | | | | 403/41 |
| 5,285,349 | A | * | 2/1994 | Zander | H02B 1/26 |
| | | | | | 361/728 |
| 5,690,505 | A | | 11/1997 | Hirata | |
| 6,084,365 | A | | 7/2000 | Anderson et al. | |
| 7,922,149 | B2 | | 4/2011 | Anderson et al. | |
| 9,067,091 | B2 | | 6/2015 | Caliendo et al. | |
| 9,620,265 | B2 | * | 4/2017 | Peterson | H02G 3/083 |
| 9,954,411 | B2 | | 4/2018 | Anderson et al. | |
| 10,299,394 | B2 | * | 5/2019 | Zhong | F04D 25/068 |
| 2015/0303766 | A1 | * | 10/2015 | Anderson | H05K 5/0247 |
| | | | | | 310/71 |
| 2019/0296453 | A1 | | 9/2019 | Hata et al. | |

FOREIGN PATENT DOCUMENTS

CN 216481262 U 5/2022

* cited by examiner

*Primary Examiner* — Reinaldo Sanchez-Medina

(57) ABSTRACT

There is described an actuator for a damper comprising an electrical circuit, a cable coupled to the electrical circuit, a lower housing supporting the electrical circuit, and an upper housing coupled to the lower housing. The electrical circuit controls positions of the damper. The cable provides power and control to the electrical circuit. The lower housing includes a first trough and a second trough to provide support for the cable in a first direction. The upper housing includes a first protuberance and a second protuberance to provide support for the cable in a second direction. The first and second protuberances are positioned offset from the first and second troughs of the lower housing.

16 Claims, 5 Drawing Sheets

ACTUATOR FOR A DAMPER AND METHOD THEREOF

FIELD OF THE INVENTION

This application relates to the field of fire protection systems and, more particularly, to actuators for fire and smoke dampers of fire protection systems.

BACKGROUND

Fire protection systems include active systems and passive systems. Active systems are based on some type of action to perform their intended purpose, such as fire detection, fire suppression, and fire sprinklers. Passive systems may perform their intended function without human interaction, such as fireproofing, emergency lighting, and dampers. Dampers of a passive fire protection system include fire dampers and smoke dampers, which protect a facility and its occupants from smoke and fire damage. A passive system also suppresses the spread of fire and smoke to provide first responders with additional time to act.

Fire dampers and smoke dampers are components of a Heating Ventilation Air Conditioning ("HVAC") System. The dampers hinder heat, fire, and smoke from spreading throughout a facility by preventing them from circulating through the air ducts and vents. When a fire emergency is detected, the damper closes and cuts off air distribution to various areas of the facility, thereby minimizing the amount of oxygen feeding the fire and smoke travelling to other areas where occupants may be located.

Fire dampers and smoke dampers include actuators to control the open and close positions of the dampers. For fire protection systems, the dampers include wiring for connections to power sources and control systems. The cables for such wiring need to be held securely in place without damaging the internal wiring in order to ensure proper operation of the actuators. Conventional actuators typically include an additional piece, like a grommet, or a threaded connector that pinches the cable as the nut is tightened over the gland. Conventional actuators also utilize complex assembly techniques to achieve a secure fit without damaging the cables. Unfortunately, added components and cumbersome assembly process for securing the wiring add to the cost of the actuator.

SUMMARY

In accordance with one embodiment of the disclosure, there is provided a strain relief approach for securing cables of an actuator of a fire and/or smoke damper. The approach avoids damage to the wiring and insulation of the cables and avoids potential shorting of electrical circuits during test and operation. The approach also minimizes the component cost and assembly time cost of the actuator.

The strain relief approach integrates strain relief in the housing design without an additional piece. The approach also simplifies and reduces assembly time by routing cables through conduit openings without special maneuvering or orientation. As a result, strain relief of the cable is achieved when the housing parts are fastened together. Further, the approach allows for a controlled loading of the conductors that requires no additional buildup or thick section on the cable harness to prevent crushing/tearing of the conductor insulation.

One aspect is an actuator for a damper comprising an electrical circuit, a cable coupled to the electrical circuit, a lower housing supporting the electrical circuit, and an upper housing coupled to the lower housing. The electrical circuit controls positions of the damper. The cable provides power and control to the electrical circuit. The lower housing includes a first trough and a second trough to provide support for the cable in a first direction. The upper housing includes a first protuberance and a second protuberance to provide support for the cable in a second direction. The first and second protuberances are positioned offset from the first and second troughs of the lower housing.

Another aspect is a method of an actuator for a damper. An electrical circuit is supported to control positions of the damper by a lower housing, the lower housing including a first trough and a second trough. A cable is coupled to the electrical circuit and provides power and control to the electrical circuit. The first trough and the second trough of the lower housing provide support for the cable in a first direction. An upper housing is coupled to the lower housing. A first protuberance and a second protuberance of the upper housing provide support for the cable in a second direction. The first and second protuberances of the upper housing are positioned offset from the first and second troughs of the lower housing.

The above-described features and advantages, as well as others, will become more readily apparent to those of ordinary skill in the art by reference to the following detailed description and accompanying drawings. While it would be desirable to provide one or more of these or other advantageous features, the teachings disclosed herein extend to those embodiments which fall within the scope of the appended claims, regardless of whether they accomplish one or more of the above-mentioned advantages.

BRIEF DESCRIPTION OF THE DRAWINGS

For a more complete understanding of the present disclosure, and the advantages thereof, reference is now made to the following descriptions taken in conjunction with the accompanying drawings, wherein like numbers designate like objects.

DETAILED DESCRIPTION

Figure 1:
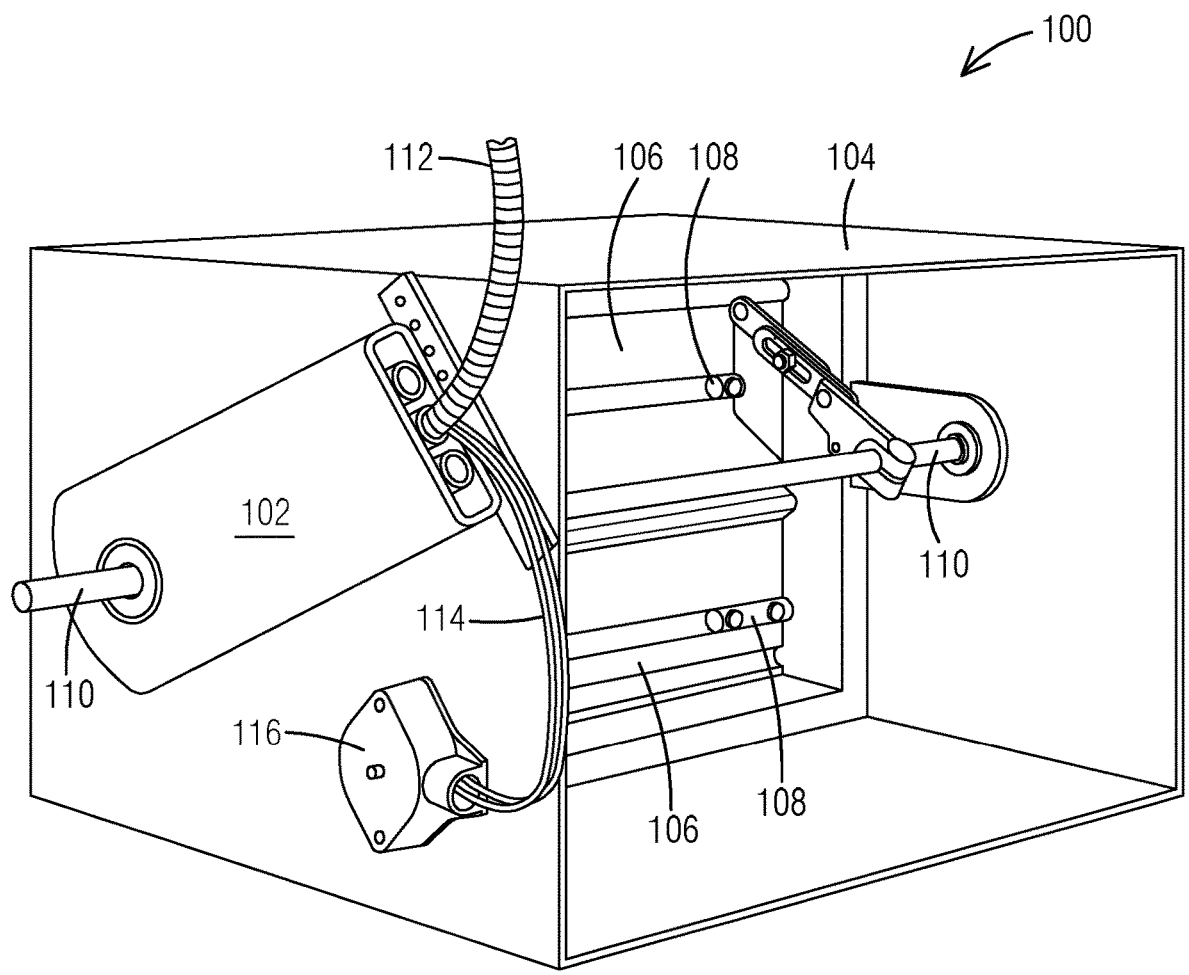
FIG. 1 is an illustration of a fire and/or smoke damper, including an actuator, in an example implementation that is operable to employ techniques described herein.

Various technologies that pertain to systems and actuators that provide strain relief for their power and/or control cables will now be described with reference to the drawings, where like reference numerals represent like elements throughout. The drawings discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged apparatus. It is to be understood that functionality that is described as being carried out by certain system elements may be performed by multiple elements. Similarly, for instance, an element may be configured to perform functionality that is described as being carried out by multiple elements. The numerous innovative teachings of the present application will be described with reference to exemplary non-limiting embodiments.

The actuator provides an integrated strain relief feature for power and control cables, including power wires and auxiliary switch cables, for an actuator of a rotary fire and/or smoke damper actuator, in compliance with UL60730. The actuator significantly decreases assembly time from previous solutions and minimizes any need for additional parts. In particular, the actuator includes a trough feature that replaces conventional cable securing methods, such as wrapping wires around a structural post. The trough feature achieves strain relief while being integrated into the actuator lower housing, such as an aluminum diecast gear train chassis. The actuator also includes a pinch feature that is incorporated into the actuator upper housing, such as a plastic housing, which protects the actuator internals. The trough feature maintains the cables and corresponding wires in place without loading during the assembly process. Once the housing is installed, the cables and their wires become forced into a position that keeps them from being pulled out of, or pushed into, the actuator.

Referring to FIG. 1, there is shown an illustration of a fire and/or smoke damper 100, including an actuator 102, in an example implementation that is operable to employ techniques described herein. The damper 100 includes a frame 104 and multiple adjustable blocking members 106 such as vanes, blades, fins, louvers or the like. The blocking members 106 are connected to rotatable shafts 108, which in turn are connected to a control shaft 110. The control shaft 110 connects to the actuator 102 and mechanically couples to the rotatable shafts 108. Rotation of the control shaft 110 results in rotations of the rotatable shafts 108 and their corresponding blocking members 106.

As the blocking members 106 rotate, they either open the damper 100 to allow air to flow of therethrough or close the damper to block the flow of air therethrough. In some situations, the blocking members 106 may also be oriented in positions intermediate the fully open and fully closed positions, thus only partially restricting the flow of air through the damper. During a fire emergency, the actuator 102 operates the blocking members 106 to close, or remain closed, in order to hinder the ability of heat, fire, and smoke to spread throughout a facility.

The actuator 102 is operable to control the damper 100 by rotating the blocking members 106 of the damper. The actuator 102 is shown physically attached to the damper 100 in FIG. 1. For some embodiments, the actuator 102 may be coupled to other wires 114 in order to connect to additional devices, such as an electronic fusible link (EFL) 116 or sensor.

Figure 2:
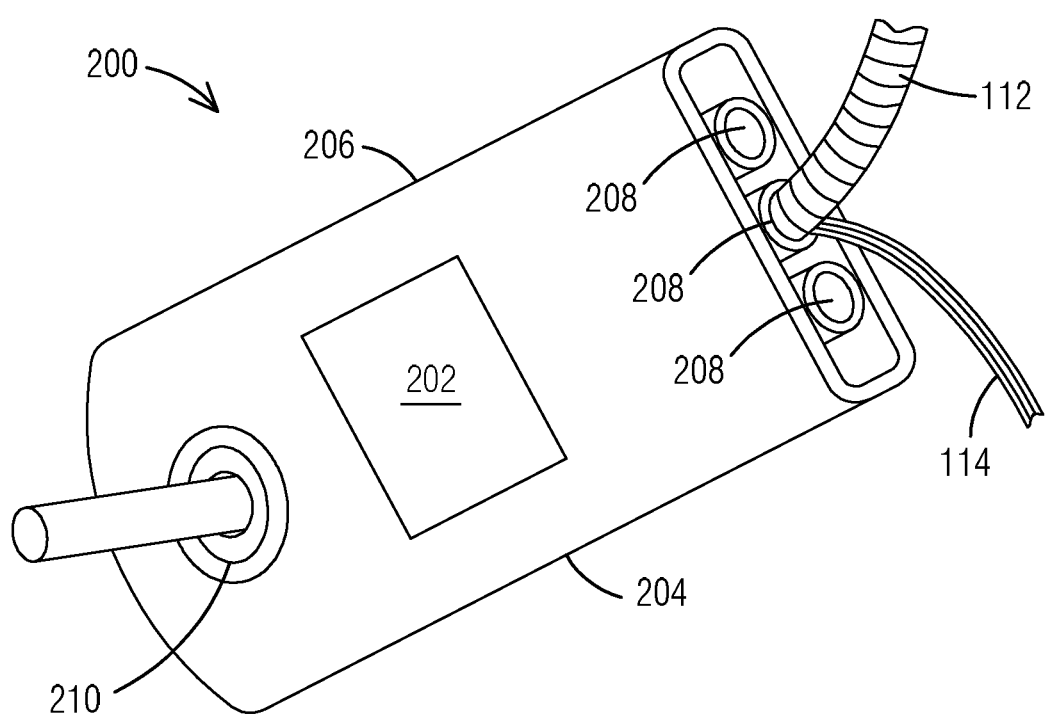
FIG. 2 depicts an example implementation of the actuator of FIG. 1.

Referring to FIG. 2, there is shown a close-up view of an example implementation of the actuator 102. The actuator 102 generally includes an electrical circuit 202 to control positions of the damper 100 as well as other components, such as a power supply circuitry, a motor controller, a driving member in the form of a motor, and a motor/damper interface. The actuator 102 also includes lower and upper housing 204, 206 to protect and otherwise support the electrical circuit 202 and its associated component, as well as maintain the actuator in proximity to the damper 100. For some embodiments, the lower housing 204 including one or more troughs integrated therein may be constructed of a die-cast metallic material, such as aluminum. For some embodiments, the upper housing 206 including the one or more protuberances integrated therein may be constructed of a moldable polymeric material, such as plastic. The actuator 102 further includes one or more conduits 208 for receiving the cables 112 coupled to the actuator for power and/or control.

Each cable 112 coupled to the electrical circuit 202, so each cable provides power and control to the electrical circuit. Each cable may be an individual cable or multiple, distinct cables. For example, for some embodiments, each cable 112 may include a first cable providing power to the electrical circuit and a second cable providing control information to the electrical circuit.

Figure 3:
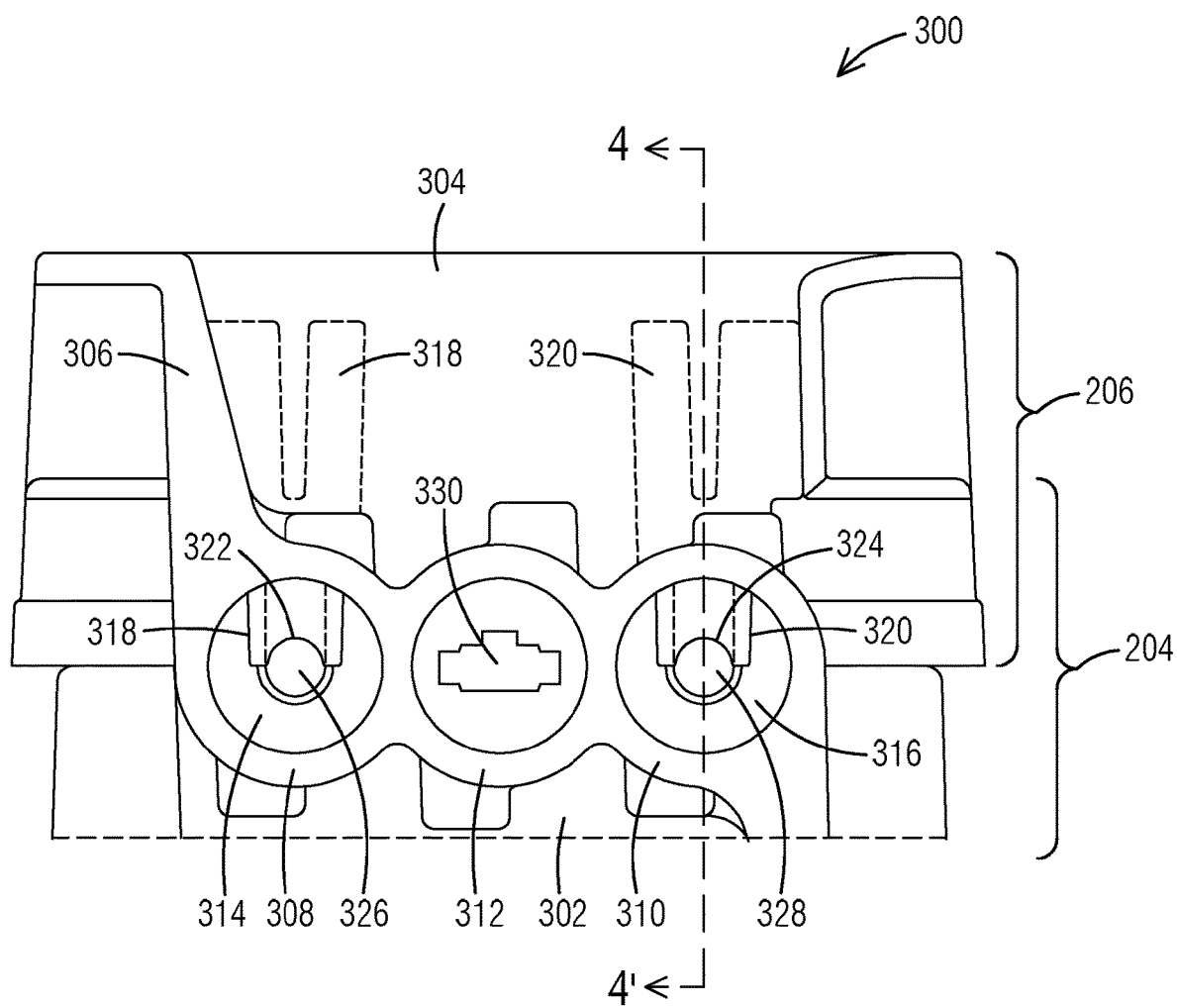
FIG. 3 is a simplified, close-up view of an end portion of the actuator of FIG. 1.

Referring to FIG. 3, there is shown a simplified, close-up view of an end portion 300 of the actuator 102. The end portion 300 includes components of the lower housing 204 and the upper housing 206. The lower and upper housings 204, 206, when attached to each other, protect the actuator internals. The lower housing 204 is positioned substantially at a first side 302 of the actuator 102, and the upper housing 206 is positioned substantially at a second side 304 of the actuator opposite the first side. Even so, some portions of one housing 204, 206, may extend to the other side 302, 304 of the actuator 102. For example, one end part 302 of the lower housing 204 may extend toward the second side 304 of the actuator 104 where the upper housing 206 is positioned.

The housing includes one or more conduit ports 308, 310 to support corresponding cables 112 and, thus, allow wires to be fed through the ports. One or more ports 312 may also receive other wires 114 in order to connect the electrical circuit 202 to additional devices. One or more cables 112 are positioned on a U-shaped trough 314, 316 of the lower plate or housing 204. The upper housing 206 includes protuberances 318, 320 that pinch down on the cables 112 to provide strain relief. Each protuberance 318, 320 include an arcuate end 322, 324 for pinching down on the cables 112. As shown in FIG. 3, the combination of the U-shape of each trough 314, 316 and its corresponding arcuate end 322, 324 of each protuberance 318, 320 form a channel 326, 328 for receiving and securing the cables 112 from above and below as well as support the cables laterally from the sides. For some embodiments, the actuator 104 may also include one or more openings 330 to support other wires 114 for connection to additional devices.

In view of the integration of the trough and protuberance in the lower and upper housings 204, 206, the assembly time to implement the strain relief feature may be less that half the time required for conventional approaches. In addition, the above-described housing features provide protection of the cables 112 traversing through the conduit ports 308, 310 to achieve IP40 ingress protection or better, such as protection from tools and small wires greater than 1 millimeter. Further, the housing features secure cable 112 to the actuator 102 to comply with industry safety standards. For example, the housing features maintain the cables 112 so that the do not move appreciably during UL60730 wire pull test at the conduit ports 308, 310.

Figure 4:
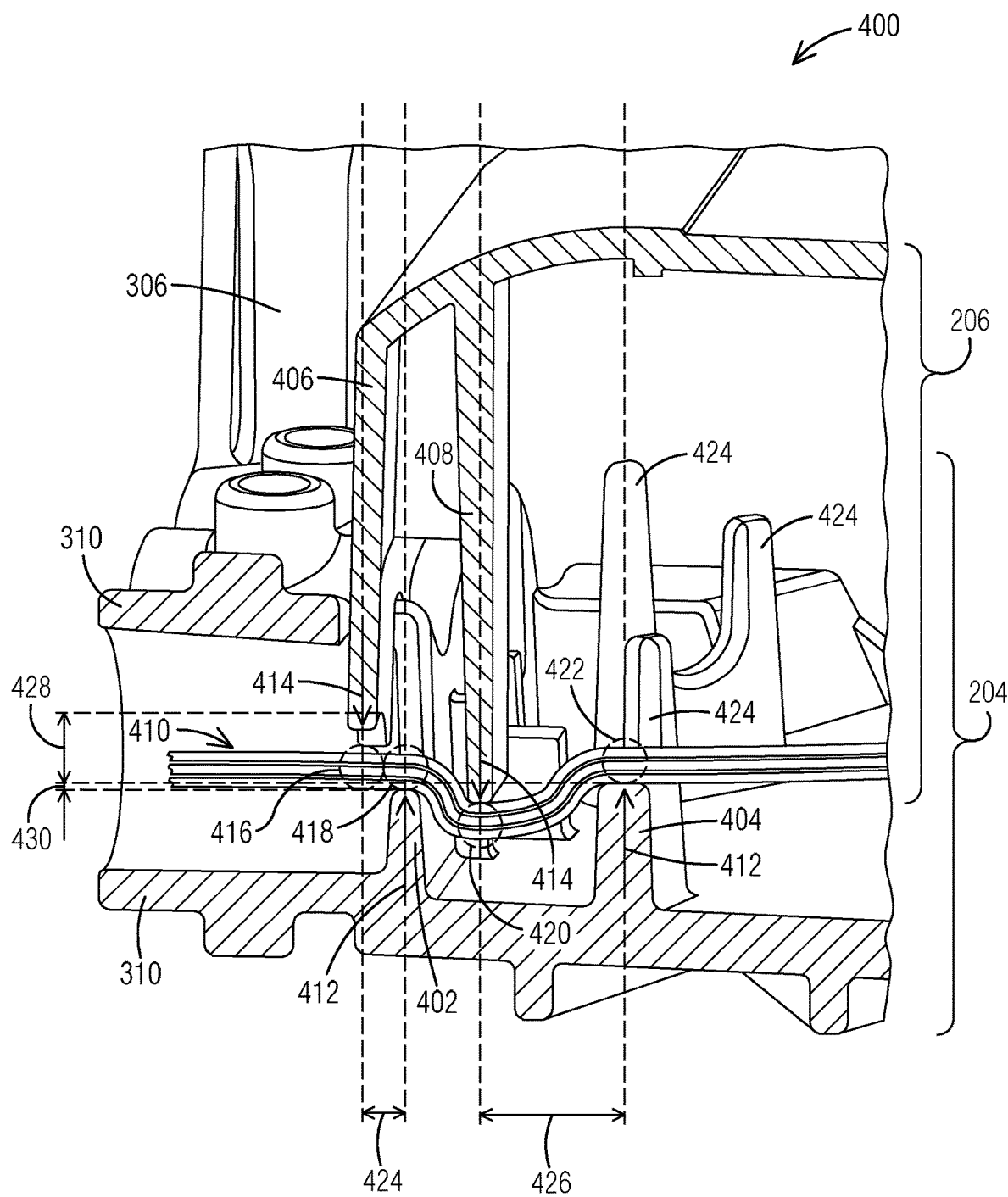
FIG. 4 is a cross-sectional view of the end portion of the actuator of FIG. 1 shown along line 4-4' of FIG. 3.

Referring to FIG. 4, there is shown a cross-sectional view of an end portion 400 of the actuator for a damper shown along line 4-4' of FIG. 3. The end portion 400 includes a lower housing 204 and an upper housing 206. One end of the end portion 400 includes one or more conduit ports, such as conduit port 310. The lower housing 204 includes a first trough 402 and a second trough 404 in which the troughs are integrated with the lower housing. The upper housing 206 includes a first protuberance 406 and a second protuberance 408 in which the protuberances are integrated with the upper housing. Thus, the first and second protuberances 406, 408 are an integral part of the upper housing 206, and the first and second troughs 402, 404 are an integral part of the lower housing 204. For some embodiments, the troughs 402, 404 are cast into the lower die-cast aluminum plate or housing 204 and, to provide the pinch feature, the protuberances 406, 408 comes down from the injection molded plastic housing 206.

One or more cables 410, and their associated wires, traverse the conduit port 310 and continue to pass the first and second troughs 402, 404 and the first and second protuberances 406, 408. The lower housing 204 supports the electrical circuit 202, and the first trough 402 and the second trough 404 of the lower housing provide support for the cable or cables 410 in a first direction 412. The upper housing 206 is coupled to the lower housing 204, and the first protuberance 406 and the second protuberance 408 of the upper housing provide support for the cable or cables 410 in a second direction 414. The first direction 412 is substantially opposite the second direction 414.

Each cable 410 includes contact points 416, 418, 420, 422 that alternate between the protuberances 406, 408 and the troughs 402, 404. In particular, when the lower and upper housings 204, 206 are assembled, the first protuberance exerts a first force against a first contact point 416 in the second direction 414, and the first trough exerts a second force against the second contact point 418 in the first direction 412. In addition, the second protuberance exerts a third force against the third contact point 420 in the second direction, and the second trough exerts a fourth force against the fourth contact point 422 in the first direction. The first and second protuberances 406, 408 of the upper housing 206 secure select portions of the cable 112 against the first and second troughs 402, 404 of the lower housing 204 without subjecting substantial strain on the cable. By alternating forces in this manner, the actuator 102 secures their cables 112 while providing strain relief.

The positioning, lengths, and shape of the troughs 402, 404 and the protuberances 406, 408 may be varied to maximize a secure fit while maintaining strain relief. In order to alternate between the protuberances 406, 408 and the troughs 402, 404, the first and second protuberances the upper housing 206 may be positioned offset from the first and second troughs of the lower housing 204. For some embodiments, a first offset 424 between the first protuberance 406 and the first trough 402 is less than a second offset 426 between the second protuberance 408 and the second trough 404. Accordingly, the closer proximity of the first protuberance 406 to the first trough 402 provides substantially secure support for the cable 112 at the first and second contact points 416, 418. For some embodiments, a protruding difference 428 between the first and second protuberances 406, 408 is greater than a height different 430 between the first and second troughs 402, 404. Since this protruding difference 428 follows the offset difference 424, 426 and supports the cable 112 in a different way, the troughs 402, 404 and the protuberances 406, 408 provide a secure fit while maintaining strain relief.

For some embodiments, the troughs 402, 404 provide lateral support for the cable or cables 112. Each of first and second troughs 402, 404 have a U-shaped structure to support the cable 112 laterally and direct the cable in the first direction 412. Likewise, the first and second protuberances 406, 408 have a half-circular end portions to support the cable laterally and direct the cable in the second direction 414.

Figure 5:
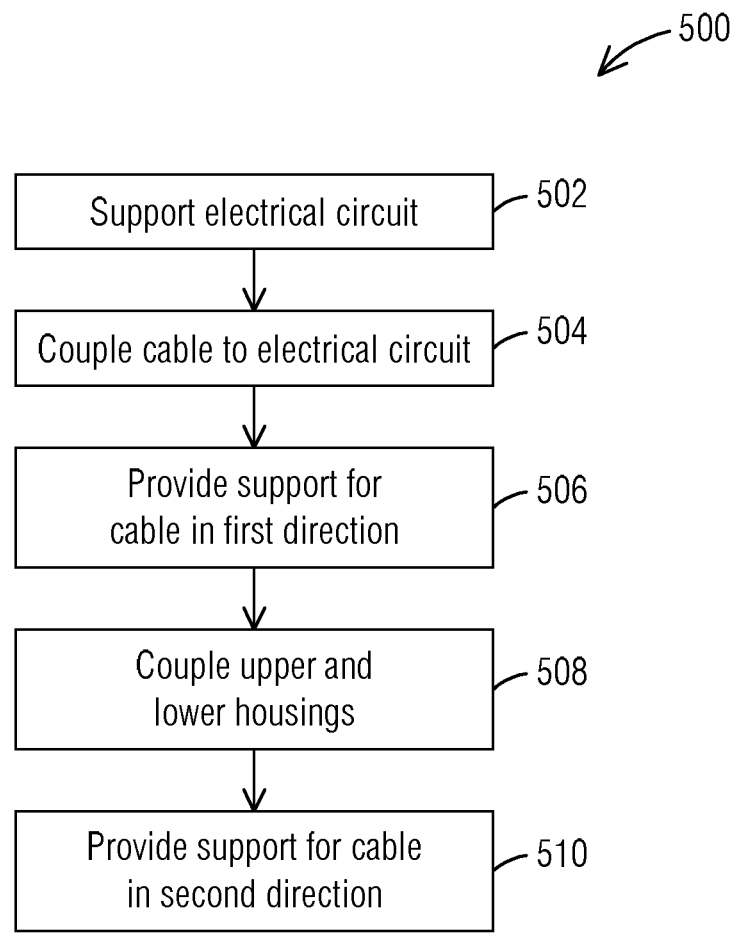
FIG. 5 is a flow diagram of an operation in an example implementation that is operable to employ the techniques described herein.

Referring to FIG. 5, there is shown a flow diagram of an operation 500 in an example implementation that is operable to employ the techniques described herein. The operation 500 represents a method of an actuator 102 for a damper 100. An electrical circuit 202 for controlling positions of the damper 100 is supported (502) by a lower housing 204. The lower housing 204 including a first trough 402 and a second trough 404. A cable 112 is coupled (504) to the electrical circuit 202. The cable 112 provides power and control to the electrical circuit 202. For some embodiments, the cable 112 includes a first cable providing power to the electrical circuit 202 and a second cable providing control information to the electrical circuit. The cable includes contact points 416, 418, 420, 422 that alternate between the protuberances 406, 408 and the troughs 402, 404.

The lower and upper housings 204, 206 are positioned adjacent to each other to protect the internals of the actuator 102 and secure the cable 112 to the actuator. In this manner, the upper housing and the lower housing are coupled (508) to each other. Before or in response to coupling (508) the housings 204, 206, support for the cable 112 in a first direction 412 is provided (506) by the first trough 402 and the second trough 404 of the lower housing 204. For some embodiments, each of first and second troughs 402, 404 have a U-shaped structure to support the cable 112 laterally and direct the cable in the first direction 412. Also, support for the cable 112 in a second direction 414 is provided (510) by a first protuberance 406 and a second protuberance 408 of the upper housing 206, in which the first direction is substantially opposite the second direction. The first and second protuberances 406, 408 of the upper housing 206 secure select portions of the cable 112 against the first and second troughs 402, 404 of the lower housing 204 without subjecting substantial strain on the cable. Also, the first and second protuberances 406, 408 are an integral part of the upper housing 206, and the first and second troughs 402, 404 are an integral part of the lower housing 204, For some embodiments, the first and second protuberances 406, 408 of the upper housing 206 may be positioned offset from the first and second troughs 402, 404 of the lower housing 204. For some embodiments, the first offset 424 between the first protuberance 406 and the first trough 402 is less than a second offset 426 between the second protuberance 408 and the second trough 404. For some embodiments, each of the first and second protuberances 406, 408 have a half-circular end portion to support the cable laterally and direct the cable in the second direction 414. For some embodiments, a protruding difference 428 between the first and second protuberances 406, 408 is greater than a height different 430 between the first and second troughs 402, 404.

Those skilled in the art will recognize that, for simplicity and clarity, the full structure and operation of all data processing systems suitable for use with the present disclosure are not being depicted or described herein. Also, none of the various features or processes described herein should be considered essential to any or all embodiments, except as described herein. Various features may be omitted or duplicated in various embodiments. Various processes described may be omitted, repeated, performed sequentially, concurrently, or in a different order. Various features and processes described herein can be combined in still other embodiments as may be described in the claims.

It is important to note that while the disclosure includes a description in the context of a fully functional system, those skilled in the art will appreciate that at least portions of the mechanism of the present disclosure are capable of being distributed in the form of instructions contained within a machine-usable, computer-usable, or computer-readable medium in any of a variety of forms, and that the present disclosure applies equally regardless of the particular type of instruction or signal bearing medium or storage medium utilized to actually carry out the distribution. Examples of machine usable/readable or computer usable/readable mediums include nonvolatile, hard-coded type mediums such as read only memories (ROMs) or erasable, electrically programmable read only memories (EEPROMs), and user-recordable type mediums such as floppy disks, hard disk drives and compact disk read only memories (CD-ROMs) or digital versatile disks (DVDs).

Although an example embodiment of the present disclosure has been described in detail, those skilled in the art will understand that various changes, substitutions, variations, and improvements disclosed herein may be made without departing from the spirit and scope of the disclosure in its broadest form.

What is claimed is:

1. An actuator for a damper comprising:
   an electrical circuit to control positions of the damper;
   a cable coupled to the electrical circuit, the cable providing power and control to the electrical circuit;
   a lower housing supporting the electrical circuit, the lower housing including a first trough and a second trough to provide support for the cable in a first direction; and
   an upper housing coupled to the lower housing, the upper housing including a first protuberance and a second protuberance to provide support for the cable in a second direction, the first and second protuberances being positioned offset from the first and second troughs of the lower housing,
   wherein a first offset between the first protuberance and the first trough is less than a second offset between the second protuberance and the second trough, and
   wherein a protruding difference between the first and second protuberances is greater than a height different between the first and second troughs.

2. The actuator as described in claim 1, wherein the first and second protuberances of the upper housing secure select portions of the cable against the first and second troughs of the lower housing without subjecting substantial strain on the cable.

3. The actuator as described in claim 1, wherein the first and second protuberances are an integral part of the upper housing and the first and second troughs are an integral part of the lower housing.

4. The actuator as described in claim 1, wherein the cable includes a first cable providing power to the electrical circuit and a second cable providing control information to the electrical circuit.

5. The actuator as described in claim 1, wherein the first direction is substantially opposite the second direction.

6. The actuator as described in claim 1, wherein the first and second troughs have a U-shaped structure to support the cable laterally and direct the cable in the first direction.

7. The actuator as described in claim 1, wherein the first and second protuberances have a half-circular end portion to support the cable laterally and direct the cable in the second direction.

8. The actuator as described in claim 1, wherein the cable includes contact points that alternate between the protuberances and the troughs.

9. A method of an actuator for a damper, the method comprising:
   supporting an electrical circuit to control positions of the damper by a lower housing, the lower housing including a first trough and a second trough;
   coupling a cable to the electrical circuit, the cable providing power and control to the electrical circuit;
   providing support for the cable in a first direction by the first trough and the second trough of the lower housing;
   coupling an upper housing to the lower housing; and
   providing support for the cable in a second direction by a first protuberance and a second protuberance of the upper housing, the first and second protuberances of the upper housing being positioned offset from the first and second troughs of the lower housing, wherein a first offset between the first protuberance and the first trough is less than a second offset between the second protuberance and the second trough, and wherein a protruding difference between the first and second protuberances is greater than a height different between the first and second troughs.

10. The method as described in claim 9, wherein the first and second protuberances of the upper housing secure select portions of the cable against the first and second troughs of the lower housing without subjecting substantial strain on the cable.

11. The method as described in claim 9, wherein the first and second protuberances are an integral part of the upper housing and the first and second troughs are an integral part of the lower housing.

12. The method as described in claim 9, wherein the cable includes a first cable providing power to the electrical circuit and a second cable providing control information to the electrical circuit.

13. The method as described in claim 9, wherein the first direction is substantially opposite the second direction.

14. The method as described in claim 9, wherein the first and second troughs have a U-shaped structure to support the cable laterally and direct the cable in the first direction.

15. The method as described in claim 9, wherein the first and second protuberances have a half-circular end portion to support the cable laterally and direct the cable in the second direction.

16. The method as described in claim 9, wherein the cable includes contact points that alternate between the protuberances and the troughs.

* * * * *